United States Patent
Sim et al.

(10) Patent No.: US 9,559,115 B2
(45) Date of Patent: Jan. 31, 2017

(54) THREE-DIMENSIONAL SEMICONDUCTOR MEMORY DEVICES INCLUDING A VERTICAL CHANNEL

(71) Applicants: Jaesung Sim, Hwaseong-si (KR); Youngwoo Park, Seoul (KR)

(72) Inventors: Jaesung Sim, Hwaseong-si (KR); Youngwoo Park, Seoul (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/644,256

(22) Filed: Mar. 11, 2015

(65) Prior Publication Data

US 2015/0303213 A1 Oct. 22, 2015

(30) Foreign Application Priority Data

Apr. 21, 2014 (KR) .................. 10-2014-0047447

(51) Int. Cl.
| | |
|---|---|
| *H01L 29/10* | (2006.01) |
| *H01L 27/115* | (2006.01) |
| *H01L 29/267* | (2006.01) |
| *H01L 29/165* | (2006.01) |
| *H01L 29/78* | (2006.01) |

(52) U.S. Cl.
CPC ..... *H01L 27/11582* (2013.01); *H01L 27/1157* (2013.01); *H01L 29/1041* (2013.01); *H01L 29/165* (2013.01); *H01L 29/267* (2013.01); *H01L 29/7827* (2013.01)

(58) Field of Classification Search
CPC ............ H01L 27/1157; H01L 27/11578; H01L 27/11582; H01L 29/7926; H01L 29/66833
USPC .......................................... 257/66, 314–324
See application file for complete search history.

(56) References Cited

U.S. PATENT DOCUMENTS

| | | | |
|---|---|---|---|
| 8,575,655 | B2 | 11/2013 | Bedell et al. |
| 8,580,659 | B2 | 11/2013 | Zhang et al. |
| 8,582,361 | B2 | 11/2013 | Maejima |
| 8,610,194 | B2 | 12/2013 | Aritome |
| 8,681,551 | B2 | 3/2014 | Maejima |
| 8,687,426 | B2 | 4/2014 | Fishburn |
| 8,743,641 | B2 | 6/2014 | Chen et al. |
| 8,750,044 | B2 | 6/2014 | Choi |
| 2011/0156044 | A1 | 6/2011 | Lee et al. |
| 2012/0280304 | A1 | 11/2012 | Lee et al. |
| 2013/0062681 | A1* | 3/2013 | Fujiki ............... H01L 29/66833 257/324 |
| 2013/0105907 | A1 | 5/2013 | Yin et al. |
| 2013/0126819 | A1 | 5/2013 | Satoh et al. |

(Continued)

OTHER PUBLICATIONS

Lee et al. "Ge Surface-Energy-Driven Secondary Grain Growth for Vertical Channel in 3D NAND Flash Memories" The Electrochemical Society, Abstract #3230, Honolulu PRIME, 2012, 1 page.

(Continued)

*Primary Examiner* — Brook Kebede
(74) *Attorney, Agent, or Firm* — Myers Bigel, P.A.

(57) ABSTRACT

Semiconductor memory devices and methods of forming the semiconductor devices may be provided. The semiconductor memory devices may include a channel portion of an active pillar that may be formed of a semiconductor material having a charge mobility greater than a charge mobility of silicon. The semiconductor devices may also include a non-channel portion of the active pillar including a semiconductor material having a high silicon content.

20 Claims, 17 Drawing Sheets

(56) References Cited

U.S. PATENT DOCUMENTS

| | | |
|---|---|---|
| 2013/0130495 A1 | 5/2013 | Higashitani et al. |
| 2013/0256777 A1 | 10/2013 | Khoueir et al. |
| 2013/0264631 A1 | 10/2013 | Alsmeier et al. |
| 2013/0272069 A1 | 10/2013 | Rabkin et al. |
| 2013/0334488 A1 | 12/2013 | Park |
| 2014/0065810 A1* | 3/2014 | Son .................. H01L 27/11582 438/591 |

OTHER PUBLICATIONS

King et al. "Polycrystalline Silicon-Germanium Thin-Film Transistors" IEEE Transactions on Electron Devices, vol. 41, No. 9, Sep. 1994, 11 pages.

\* cited by examiner

THREE-DIMENSIONAL SEMICONDUCTOR MEMORY DEVICES INCLUDING A VERTICAL CHANNEL

CROSS-REFERENCE TO RELATED APPLICATION

This U.S. non-provisional patent application claims priority under 35 U.S.C. §119 to Korean Patent Application No. 10-2014-0047447, filed on Apr. 21, 2014, in the Korean Intellectual Property Office, the disclosure of which is hereby incorporated by reference in its entirety.

BACKGROUND

The inventive concept generally relates to the field of electronics and, more particularly, to semiconductor memory devices.

A three-dimensional integrated circuit (3D-IC) memory technique has been developed to increase memory capacity of a semiconductor memory device. The 3D-IC memory technique includes a variety of methods for arranging memory cells three-dimensionally. As well as the 3D-IC memory technique, a patterning technique for fine patterns and a multi-level cell (MLC) technique may be used to increase the memory capacity of the semiconductor memory device. However, the patterning technique for the fine patterns may be very expensive, and the MLC technique may not be suitable to increase the number of bits per a unit cell. Thus, the 3D-IC memory technique may be important to increase the memory capacity. In addition, if the patterning technique for the fine patterns and the MLC technique are combined with the 3D-IC memory technique, the memory capacity may more increase. Thus, the patterning technique for the fine patterns and the MLC technique may be developed independently of the 3D-IC memory technique.

SUMMARY

Some embodiments of the inventive concept may provide semiconductor memory devices capable of improve a cell current.

A semiconductor memory device may include an active pillar protruding from a substrate, a gate electrode adjacent to a sidewall of the active pillar, and a gate dielectric layer disposed between the active pillar and the gate electrode. The active pillar may include a first portion being in contact with the gate dielectric layer, and a second portion spaced apart from the gate dielectric layer. The first portion may include a semiconductor material of which charge mobility is greater than that of silicon.

In some embodiments, a silicon content of the second portion may be higher than that of the first portion.

In some embodiments, the first portion of the active pillar may include a first semiconductor layer, and the second portion of the active pillar may include a second semiconductor layer. The first semiconductor layer may include at least one of germanium (Ge), silicon-germanium (SiGe), gallium-arsenic (GaAs), indium-gallium-arsenic (InGaAs), and/or aluminum-gallium-arsenic (AlGaAs), and a silicon content of the second semiconductor layer may be higher than that of the first semiconductor layer.

In some embodiments, the active pillar may further include a third semiconductor layer covering a sidewall of the second semiconductor layer. The third semiconductor layer may include a silicon layer.

In some embodiments, the active pillar may include a single-layered silicon-germanium layer, and a germanium content of the first portion may be higher than that of the second portion.

In some embodiments, the semiconductor memory device may further include intergate insulating layers adjacent to the sidewall of the active pillar and disposed on and under the gate electrode. The gate dielectric layer may include a tunnel dielectric layer, a charge storage layer, and a blocking dielectric layer which are sequentially stacked on the sidewall of the active pillar, and the tunnel dielectric layer may be formed of a thermal oxide layer and may cover only a portion of the sidewall of the active pillar. The charge storage layer and the blocking dielectric layer may be disposed between the gate electrode and the active pillar and between the gate electrode and the intergate insulating layers.

In some embodiments, the gate dielectric layer may include a tunnel dielectric layer, a charge storage layer, and a blocking dielectric layer which are sequentially stacked on the sidewall of the active pillar.

In some embodiments, the first portion may have a thickness of about 50 Å or more.

In some embodiments, the active pillar may have an amorphous structure, a single-crystalline structure, or a poly-crystalline structure.

In some embodiments, the semiconductor memory device may further include intergate insulating layers adjacent to the sidewall of the active pillar and disposed on and under the gate electrode. The gate dielectric layer may extend to be disposed between the active pillar and the intergate insulating layers.

In some embodiments, the first portion of the active pillar may include an 'L'-shaped semiconductor layer.

A semiconductor memory device may include intergate insulating layers and gate electrodes alternately stacked on a substrate, an active pillar penetrating the intergate insulating layers and the gate electrodes so as to be connected to the substrate, and a first gate dielectric layer covering a sidewall of the active pillar. The active pillar may include a first portion being in contact with the first gate dielectric layer, and a second portion spaced apart from the first gate dielectric layer. The first portion may include a semiconductor material of which charge mobility is greater than that of silicon, and the second portion may include a semiconductor material having a high silicon content and may be connected to the substrate.

In some embodiments, the first gate dielectric layer may include a tunnel dielectric layer, a charge storage layer, and a blocking dielectric layer which are sequentially stacked on a sidewall of the first portion of the active pillar.

In some embodiments, the first portion of the active pillar may include a first semiconductor layer, and the second portion of the active pillar may include a second semiconductor layer. The first semiconductor layer may include the semiconductor material of which the charge mobility is greater than that of silicon. A bottom surface of the first semiconductor layer may be spaced apart from the substrate. The second semiconductor layer may include a silicon layer and may be connected to the substrate.

In some embodiments, the semiconductor memory device may further include a second gate dielectric layer disposed between the gate electrodes and the intergate insulating layers and between the first gate dielectric layer and the gate electrodes. A dielectric constant of the second gate dielectric layer may be higher than that of a silicon oxide layer.

In some embodiments, the first semiconductor layer may include at least one of germanium (Ge), silicon-germanium (SiGe), gallium-arsenic (GaAs), indium-gallium-arsenic (InGaAs), and/or aluminum-gallium-arsenic (AlGaAs).

In some embodiments, the first semiconductor layer of the active pillar may have a poly-crystalline structure.

A semiconductor memory device may include an active pillar protruding from a substrate, gate electrodes surrounding the active pillar and sequentially stacked on the substrate, and a gate dielectric layer disposed between the active pillar and the gate electrodes. The active pillar may include a first portion being in contact with the gate dielectric layer, and a second portion spaced apart from the gate dielectric layer. The first portion may include a first semiconductor layer of which charge mobility is greater that of silicon. The first semiconductor layer may have a 'L'-shape. The second portion may include a second semiconductor layer having a silicon.

In some embodiments, the first semiconductor layer may include at least one of germanium (Ge), silicon-germanium (SiGe), gallium-arsenic (GaAs), indium-gallium-arsenic (InGaAs), and/or aluminum-gallium-arsenic (AlGaAs), and the second semiconductor layer may include a silicon layer.

In some embodiments, the first portion of the active pillar may include a first silicon-germanium (SiGe) layer, and the second portion of the active pillar may include a second silicon-germanium (SiGe) layer. A silicon content of the first silicon-germanium (SiGe) layer may be lower than a silicon content of the second silicon-germanium (SiGe) layer.

In yet another aspect, a method of fabricating a semiconductor memory device may include alternately and repeatedly stacking intergate insulating layers and sacrificial layers on a substrate, patterning the intergate insulating layers and the sacrificial layers to form an active hole exposing the substrate, forming an active pillar in the active hole, the active pillar connected to the substrate, removing the sacrificial layers to form empty regions exposing a sidewall of the active pillar, forming a first gate dielectric layer on the exposed sidewall of the active pillar, and forming gate electrodes in the empty regions. The active pillar may include a first portion being in contact with the first gate dielectric layer; and a second portion spaced apart from the gate dielectric layer. The first portion may include a semiconductor material of which charge mobility is greater than that of silicon.

In some embodiments, the active pillar may be formed of a silicon-germanium layer. In this case, forming the first gate insulating layer may include oxidizing the exposed sidewall of the active pillar and causing a gradient of a germanium content according to a position in the active pillar at the same time.

In some embodiments, forming the active pillar may include sequentially forming a first semiconductor layer and a second semiconductor layer on a sidewall and a bottom surface of the active hole.

In some embodiments, the method may further include forming a second gate dielectric layer covering the sidewall and the bottom surface of the active hole before forming the first semiconductor layer. In this case, forming the active pillar may include anisotropically etching the second semiconductor layer, the first semiconductor layer, and the second gate dielectric layer to leave portions of the second and first semiconductor layers and the second gate dielectric layer on the sidewall of the active hole and to expose the substrate of the bottom surface of the active hole, and forming a third semiconductor layer covering a sidewall of the second semiconductor layer and the bottom surface of the active hole.

In some embodiments, the first semiconductor layer may include a material of which the charge mobility is greater than that of silicon, and the second semiconductor layer may include a silicon layer.

In some embodiments, forming the active pillar may further include performing a solid phase crystallization process to have a poly-crystalline structure.

DETAILED DESCRIPTION OF THE EMBODIMENTS

Figure 1:
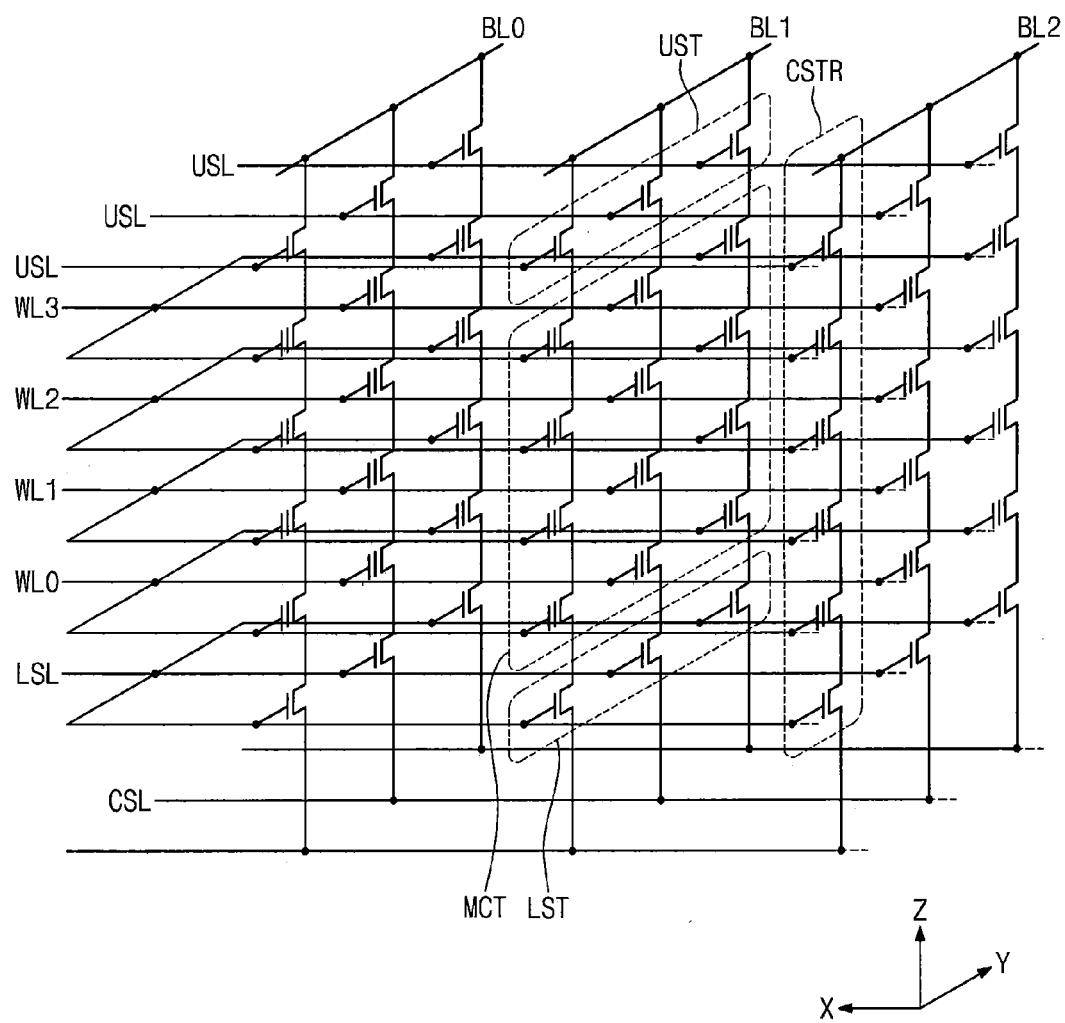
FIG. 1 is a circuit diagram of a semiconductor memory device according to example embodiments of the inventive concept.

The inventive concept will now be described more fully hereinafter with reference to the accompanying drawings, in which some embodiments of the inventive concept are shown. The advantages and features of the inventive concept and methods of achieving them will be apparent from the following embodiments that will be described in more detail with reference to the accompanying drawings. It should be noted, however, that the inventive concept is not limited to the following embodiments, and may be implemented in various forms. Accordingly, the embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an"

and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal views of the inventive concept. Accordingly, shapes of the views may be modified according to manufacturing techniques and/or allowable errors. Therefore, the embodiments of the inventive concept are not limited to the specific shape illustrated in the views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Some embodiments of aspects of the present inventive concept explained and illustrated herein include their complementary counterparts. The same reference numerals or the same reference designators denote the same elements throughout the specification.

Moreover, some embodiments are described herein with reference to cross-sectional illustrations and/or plan illustrations that are idealized illustrations. Accordingly, variations from the shapes of the illustrations as a result, for example, of manufacturing techniques and/or tolerances, are to be expected. Thus, embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Hereinafter, some embodiments of the inventive concept will be described in detail. A memory device according to some embodiments of the inventive concept is a non-volatile memory device and has a structure of a three-dimensional (3D) semiconductor memory device.

Figure 2:
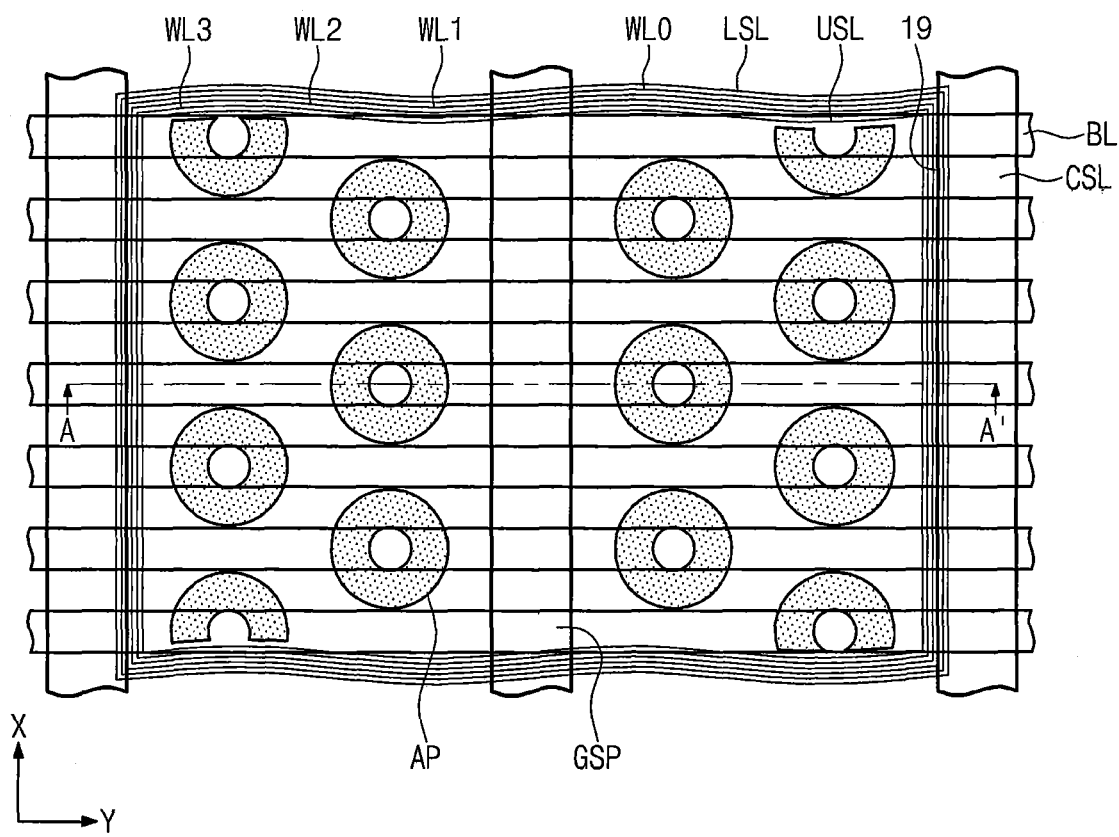
FIG. 2 is a plan view illustrating a semiconductor memory device according to example embodiments of the inventive concept.
Figure 3:
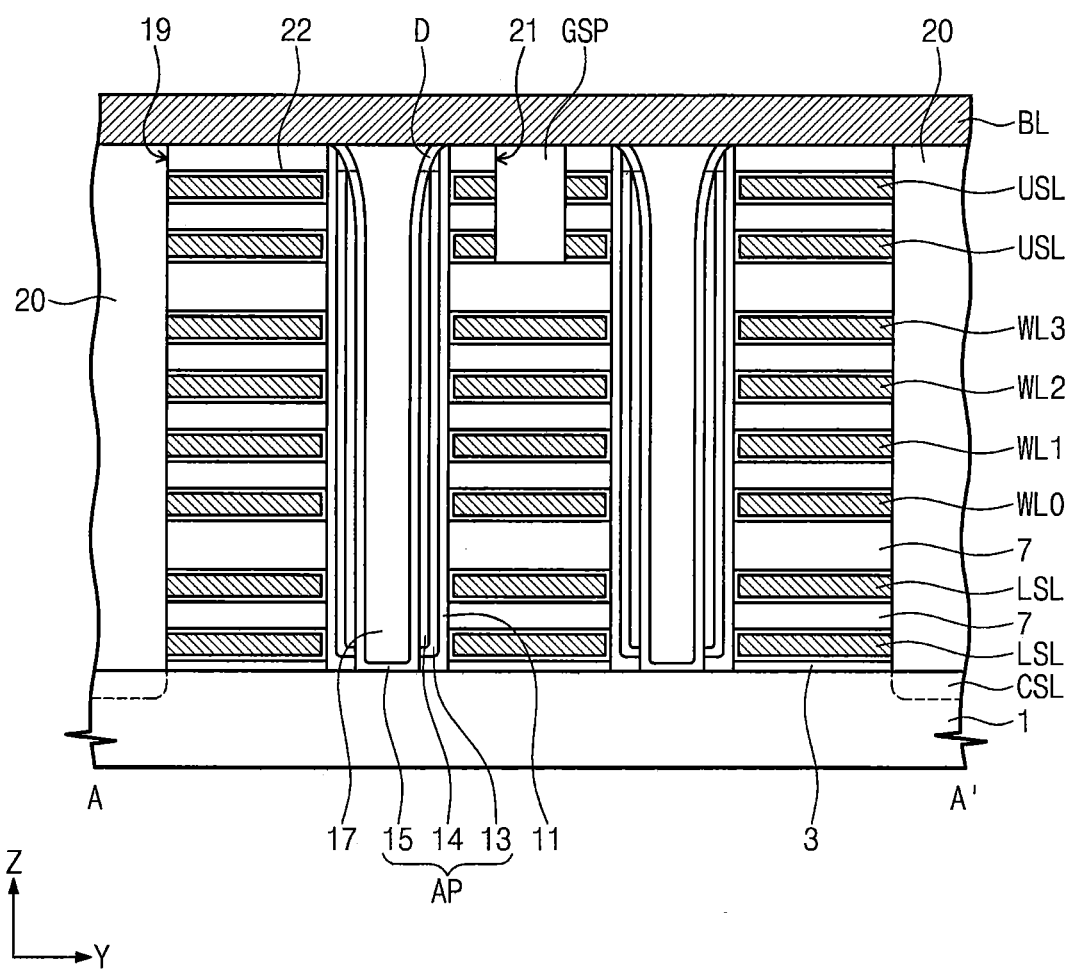
FIG. 3 is a cross-sectional view taken along the line A-A' of FIG. 2 to illustrate a semiconductor memory device according to some embodiments of the inventive concept.

FIG. 1 is a circuit diagram of a semiconductor memory device according to example embodiments of the inventive concept. FIG. 2 is a plan view illustrating a semiconductor memory device according to example embodiments of the inventive concept. FIG. 3 is a cross-sectional view taken along the line A-A' of FIG. 2 to illustrate a semiconductor memory device according to some embodiments of the inventive concept.

Referring to FIGS. 1 to 3, a vertical type semiconductor memory device according to some embodiments of the inventive concept may include a common source line CSL, a plurality of bit lines BL0, BL1, and BL2, and a plurality of cell strings CSTR disposed between the common source line CSL and the bit lines BL0, BL1, and BL2.

The common source line CSL may be a dopant injection region that is formed in a substrate 1. The substrate 1 may be a semiconductor substrate or may include the semiconductor substrate and an epitaxial semiconductor layer formed on the semiconductor substrate. The bit lines BL0, BL1, and BL2 may be conductive lines that are spaced apart from the substrate 1 and are disposed over the substrate 1. The bit lines BL0, BL1, and BL2 may be two-dimensionally arranged, and a plurality of cell strings CSTR may be connected in parallel to each of the bit lines BL0, BL1, and BL2. The cell strings CSTR may be two-dimensionally arranged on the substrate 1.

Each of the cell strings CSTR may include a lower selection transistor LST connected to the common source line CSL, an upper selection transistor UST connected to the bit line BL, and a plurality of memory cell transistors MCT disposed between the lower and upper selection transistors LST and UST. The lower selection transistor LST, the memory cell transistors MCT, and the upper selection transistor UST may be connected in series to each other in a direction vertical (e.g., perpendicular) to a top surface of the substrate 1. A lower selection line LSL, a plurality of word lines WL0 to WL3, and an upper selection line USL, which are disposed between the common source line CSL and the bit lines BL0, BL1, and BL2, may be used as gate electrodes of the lower selection transistor LST, the memory cell transistors MCT, and the upper selection transistor UST, respectively. The common source line CSL, the lower selection line LSL, the word lines WL0 to WL3, and the upper selection line USL may extend in a first direction X. The bit lines BL0, BL1, and BL2 may extend in a second direction Y intersecting the first direction X. A third direction Z may be substantially perpendicular to the first direction X and the second direction Y.

Distances of the gate electrodes of the lower selection transistors LST from the substrate 1 may be substantially equal to each other. Gate electrodes of the lower selection transistors LST may be at an equipotential state because they are connected in common to the lower selection line LSL. Likewise, gate electrodes of the memory cell transistors MCT disposed at a substantially same distance from the common source line CSL may be connected in common to one of the word lines WL0 to WL3, so they may be at an equipotential state. Since one cell string CSTR includes the plurality of memory cell transistors MCT respectively disposed at different distances from the common source line CSL, the plurality of word lines WL0 to WL3 may be sequentially stacked between the common source line CSL and the bit lines BL0, BL1, and BL2.

Each of the cell strings CSTR may include an active pillar AP that vertically extends from the substrate 1. The active pillar AP may be connected to the bit line BL. The active pillar AP may be formed to penetrate the upper selection line USL, the word lines WL0 to WL3, and the lower selection line LSL.

A first gate dielectric layer 11 may be disposed between the active pillar AP and the lines USL, WL0 to WL3, and LSL. According to some embodiments, the first gate dielectric layer 11 may include a tunnel dielectric layer, a charge storage layer, and a blocking dielectric layer. In some embodiments, the charge storage layer may not exist between the lower selection line LSL and the active pillar AP and/or between the upper selection line USL and the active pillar AP. A second gate dielectric layer 22 may be disposed between the first gate dielectric layer 11 and the lines USL, WL0 to WL3, and LSL. The second gate dielectric layer 22 may include a blocking dielectric layer. The second gate dielectric layer 22 may include a high-k dielectric layer of which a dielectric constant is higher than that of a silicon oxide layer. A drain region D may be disposed in a top end portion of the active pillar AP.

The lower and upper selection transistors LST and UST and the memory cell transistors MCT may be metal-oxide-semiconductor (MOS) field effect transistors using the active pillar AP as channel regions. The active pillar AP may have a cup shape. A first filling insulation pattern 17 may be disposed in the active pillar AP. In some embodiments, the upper selection line USL may include two upper selection lines USL that are sequentially stacked, and the lower selection line LSL may include two lower selection lines LSL that are sequentially stacked.

A buffer oxide layer 3 may be disposed on the substrate 1. Intergate insulating layers 7 may be disposed on a top one of the upper selection lines USL, between the upper selection lines USL, between a bottom one of the upper selection lines USL and the word line WL3, between the word lines WL0 to WL3, between the word line WL0 and a top one of the lower selection lines LSL, and between the lower selection lines LSL. The lower selection lines LSL, the word lines WL0 to WL3, and the upper selection lines USL which are sequentially stacked may constitute a stack structure. A second filling insulation pattern 20 may be disposed between the stack structures that are laterally adjacent to each other. The common source line CSL may be disposed in the substrate 1 under the second filling insulation pattern 20. The second filling insulation pattern 20 may be disposed in a groove 19.

A plurality of upper selection lines USL disposed at the same level may be disposed over the word line WL3 in one stack structure. A separation insulating layer GSP may be disposed between the upper selection lines USL. The cell strings coupled to the active pillars AP sharing the bit line BL may be separated from each other by the separation insulating layer GSP.

The active pillar AP may include a first portion being in contact with the first gate dielectric layer 11 and a second portion spaced apart from the first gate dielectric layer 11, and the first portion of the active pillar AP may include a semiconductor material of which a charge mobility is greater than a charge mobility of silicon. In some embodiments, the active pillar AP may include a first semiconductor layer 13, a second semiconductor layer 14, and a third semiconductor layer 15. The first semiconductor layer 13 may be an 'L'-shaped spacer. The second semiconductor layer 14 may be an T-shaped spacer. The first and second semiconductor layers 13 and 14 may be spaced apart from the substrate 1 by the first gate dielectric layer 11. The first semiconductor layer 13 may correspond to the first portion of the active pillar AP, and the second semiconductor layer 14 may correspond to the second portion of the active pillar AP. In other words, the mobility of carries flowing through the first semiconductor layer 13 may be greater that of carriers flowing through silicon. For example, the first semiconductor layer 13 may be formed of at least one of germanium (Ge), silicon-germanium (SiGe), gallium-arsenic (GaAs), indium-gallium-arsenic (InGaAs), and/or aluminum-gallium-arsenic (AlGaAs). In some embodiments, a germanium content may be higher than a silicon content in the silicon-germanium (SiGe) of the first semiconductor layer 13. The first semiconductor layer 13 may have a thickness or a width of about 50 Å or greater.

The second semiconductor layer 14 may be formed of a semiconductor layer of which a silicon content is higher than that of the first portion (e.g., the first semiconductor layer 13) of the active pillar AP. For example, the second semiconductor layer 14 may be formed of a silicon layer. However, the inventive concept is not limited thereto. In some embodiments, the second semiconductor layer 14 may be formed of a silicon-germanium (SiGe) layer having a high silicon content or a silicon carbide layer (SiC). The third semiconductor layer 15 may be in contact with the substrate 1. The third semiconductor layer 15 may be a silicon layer, a silicon-germanium (SiGe) layer having a high silicon content, or a silicon carbide layer. In some embodiments, the first semiconductor layer 13 may include a first silicon-germanium (SiGe) layer having a high germanium (Ge) content, the second semiconductor layer 14 may include a second silicon-germanium (SiGe) layer having a low germanium (Ge) content, and the third semiconductor layer 15 may include a silicon layer. In other words, the germanium content of the first silicon-germanium (SiGe) layer may be higher than the germanium content of the second silicon-germanium (SiGe) layer. For example, the first semiconductor layer 13 may include a first silicon-germanium (SiGe) layer having a germanium content of about 50% or greater, and the second semiconductor layer 14 may include a second silicon-germanium (SiGe) layer having a germanium content lower than 50%. In other words, the first semiconductor layer 13 may include a first silicon-germanium (SiGe) layer having a silicon content lower than 50%, and the second semiconductor layer 14 may include a second silicon-germanium (SiGe) layer having a silicon content of 50% or greater.

The active pillar AP may have an amorphous structure, a poly-crystalline structure, or a single-crystalline structure. In other words, the first to third semiconductor layers 13, 14, and 15 may be in the amorphous state, the poly-crystalline state, or the single-crystalline state. The first to third semiconductor layers 13, 14, and 15 may not be doped with dopants. In some embodiments, the first to third semiconductor layers 13, 14, and 15 may be doped with dopants of which a conductivity type is opposite to that of dopants doped in the common source line CSL. In some embodiments, the second semiconductor layer 14 may be omitted, and the third semiconductor layer 15 may be in direct contact with the first semiconductor layer 13.

When the semiconductor memory device according to some embodiments is driven, voltages may be applied to the gate electrodes to generate channels in the channel regions defined in a portion (i.e., the first semiconductor layer 13) of the active pillar AP adjacent to the first gate dielectric layer 11.

The charge mobility according to a material is represented in the following table 1.

TABLE 1

|  | Silicon (Si) | Germanium (Ge) | Gallium-arsenic (GaAs) |
| --- | --- | --- | --- |
| Electron mobility ($cm^2$/V-sec) | 1500 | 3900 | 8500 |
| Hole mobility ($cm^2$/V-sec) | 450 | 1900 | 400 |

Referring to the Table 1, the electron mobility of the germanium and the electron mobility of the gallium-arsenic are greater than that of the silicon. Since the portion used as the channel region is formed of the semiconductor layer having the excellent charge mobility, a cell current of the semiconductor memory device may increase.

Source/drain regions corresponding to an inversion layer may be generated in the first semiconductor layer 13 by a fringe field caused by the voltages applied to the gate electrodes. The channel region is defined between the source/drain regions. At this time, a thickness of the inversion layer may vary with the voltages applied to the gate electrodes. However, the thickness of the inversion layer may be about 50 Å or greater. Since the thickness of the first semiconductor layer 13 may be equal to or greater than the thickness of inversion layer, the charge mobility of an entire portion of the channel region may be improved. In other words, the thickness of the first semiconductor layer 13 may be about 50 Å or greater.

Now will be described a method of fabricating the semiconductor memory device.

FIGS. 4 to 9 are cross-sectional views illustrating a method of fabricating the semiconductor memory device of FIG. 3.

Figure 4:
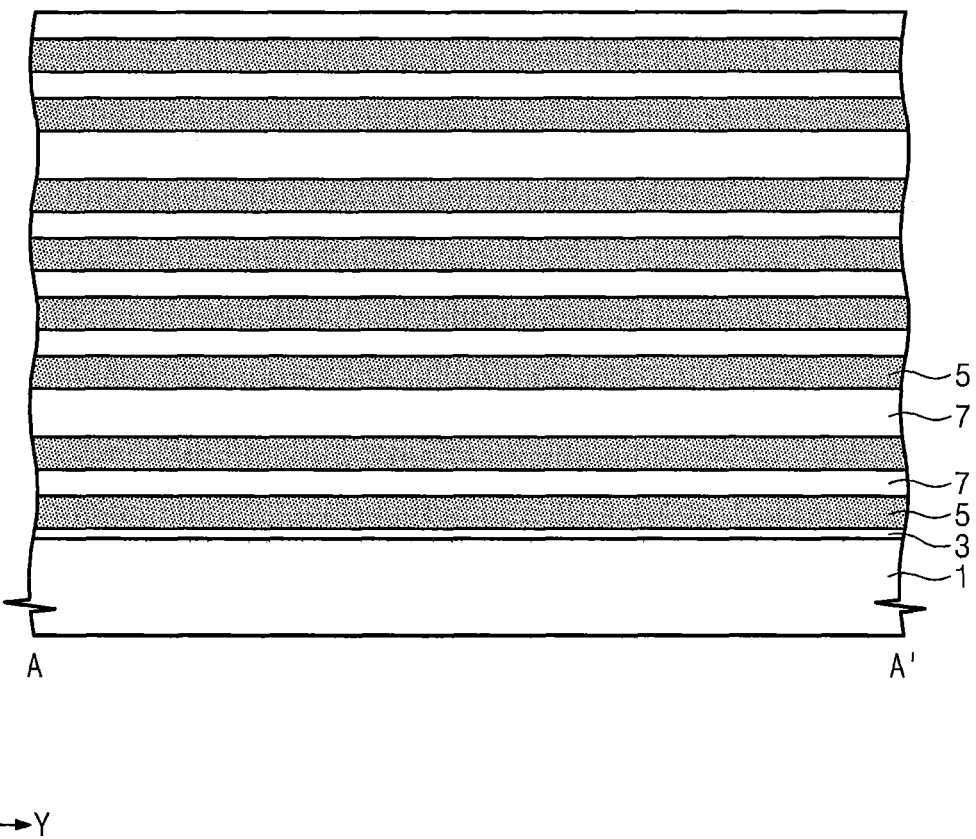
FIGS. 4 to 9 are cross-sectional views illustrating a method of fabricating the semiconductor memory device of FIG. 3.

Referring to FIG. 4, a buffer oxide layer 3 may be formed on a substrate 1. Sacrificial layers 5 and intergate insulating layers 7 may be alternately stacked on the buffer oxide layer. The sacrificial layers 5 are formed of a material having an etch selectivity with respect to the intergate insulating layers 7. For example, the intergate insulating layer 7 may be formed of a silicon oxide layer. The sacrificial layer 5 may be formed of a silicon nitride layer, a poly-silicon layer, or a silicon-germanium layer.

Figure 5:
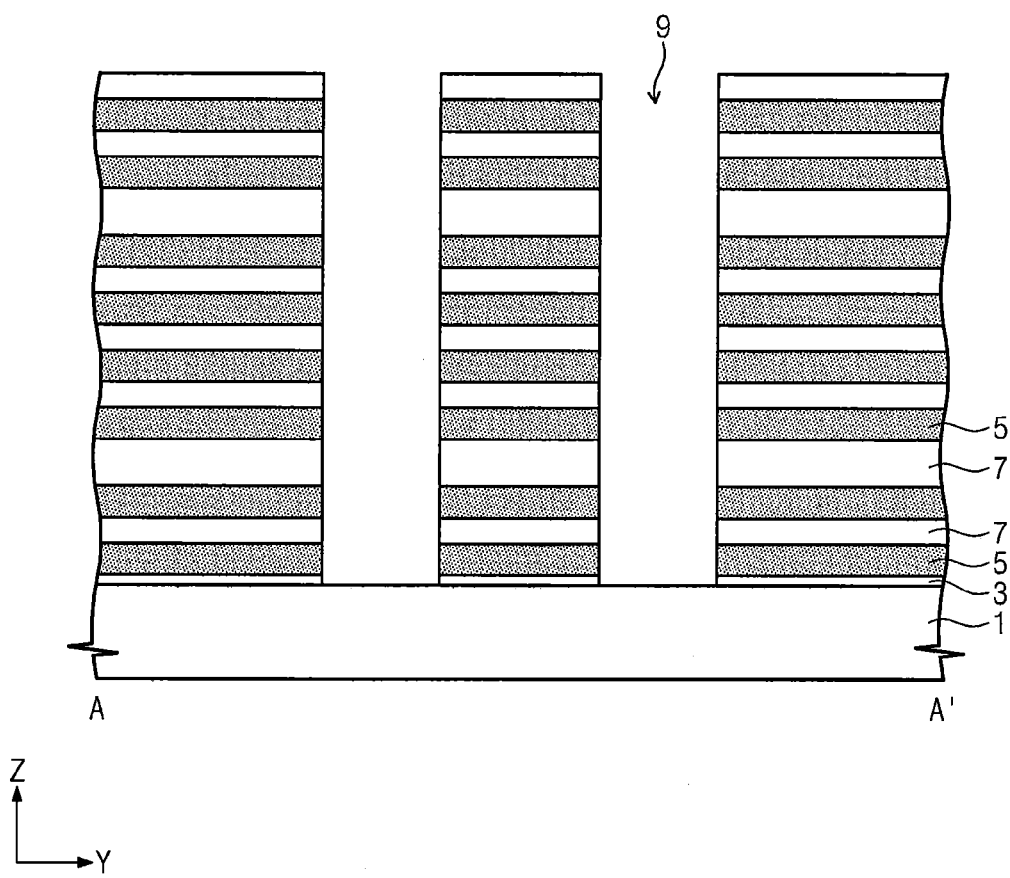

Referring to FIG. 5, the intergate insulating layers 7, the sacrificial layers 5, and the buffer oxide layer 3 may be successively patterned to form active holes 9 exposing the substrate 1.

Figure 6:
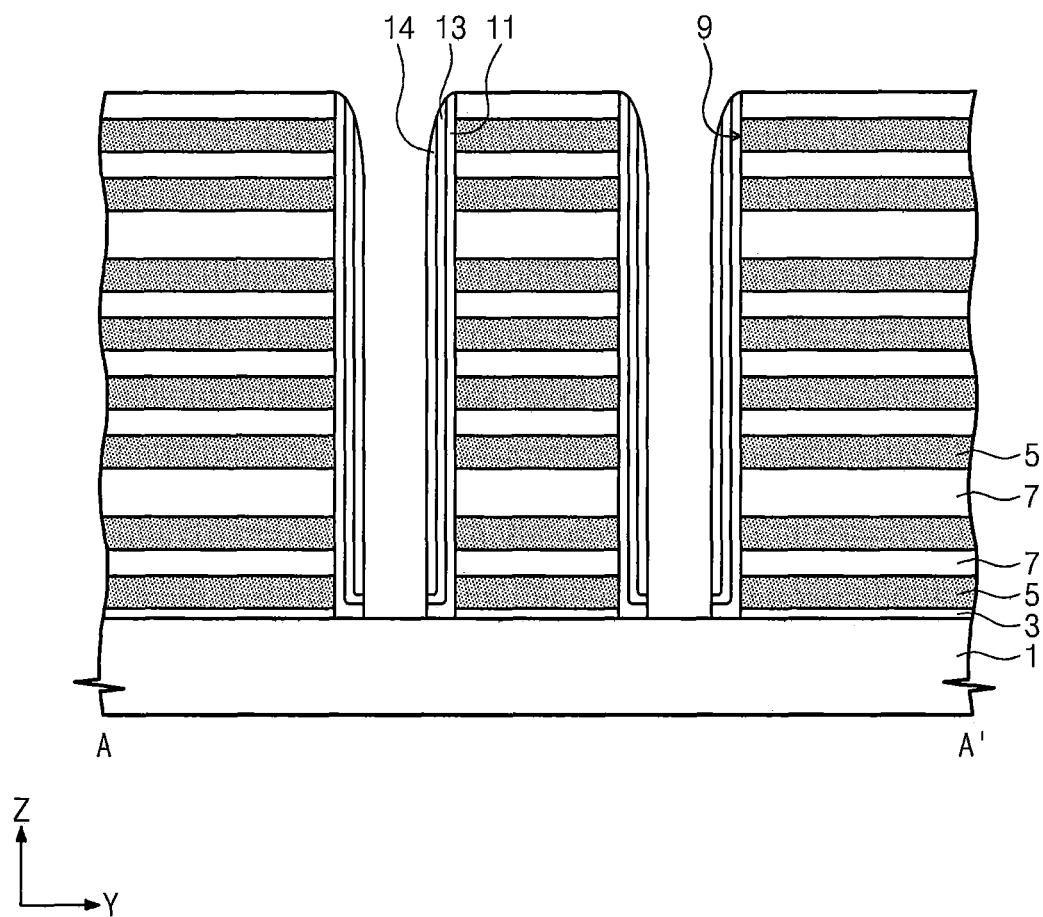

Referring to FIG. 6, a first gate dielectric layer 11, a first semiconductor layer 13, and a second semiconductor layer 14 may be conformally formed on the substrate 1 having the active holes 9 in the order named. The first gate dielectric layer 11, the first semiconductor layer 13, and the second semiconductor layer 14 may be sequentially staked on a sidewall of the active hole 9. Subsequently, the second semiconductor layer 14, the first semiconductor layer 13, and the first gate dielectric layer 11 may be anisotropically etched until the substrate 1 is exposed. Thus, the first gate dielectric layer 11, the first semiconductor layer 13, and the second semiconductor layer 14 may be formed to have spacer shapes. In some embodiments, the first gate dielectric layer 11 may be formed of a triple layer including a silicon oxide layer, a silicon nitride layer, and a silicon oxide layer. The first semiconductor layer 13 may be formed of a material of which charge mobility is greater than that of silicon. For example, the first semiconductor layer 13 may be formed of at least one of germanium (Ge), silicon-germanium (SiGe), gallium-arsenic (GaAs), indium-gallium-arsenic (InGaAs), and/or aluminum-gallium-arsenic (AlGaAs). In some embodiments, the germanium content may be higher than the silicon content in the silicon-germanium (SiGe) of the first semiconductor layer 13. The second semiconductor layer 14 may be formed of a semiconductor layer of which a silicon content is higher than that of the first semiconductor layer 13. For example, the second semiconductor layer 14 may be formed of a silicon layer. However, the inventive concept is not limited thereto. In some embodiments, the second semiconductor layer 14 may be formed of a silicon-germanium (SiGe) layer having a silicon content higher than a germanium content, or a silicon carbide layer (SiC). In some embodiments, the first semiconductor layer 13 may include a first silicon-germanium (SiGe) layer having a high germanium (Ge) content, and the second semiconductor layer 14 may include a second silicon-germanium (SiGe) layer having a low germanium (Ge) content. In other words, the germanium content of the first silicon-germanium (SiGe) layer may be higher than the germanium content of the second silicon-germanium (SiGe) layer. For example, the first semiconductor layer 13 may include a first silicon-germanium (SiGe) layer having a germanium content of 50% or greater, and the second semiconductor layer 14 may include a second silicon-germanium (SiGe) layer having a germanium content lower than 50%. In other words, the first semiconductor layer 13 may include a first silicon-germanium (SiGe) layer having a silicon content lower than 50%, and the second semiconductor layer 14 may include a second silicon-germanium (SiGe) layer having a silicon content of about 50% or greater.

While the first and second semiconductor layers 13 and 14 are formed, the first and second semiconductor layers 13 and 14 may be formed to have a poly-crystalline structure by a solid phase crystallization method.

Figure 7:
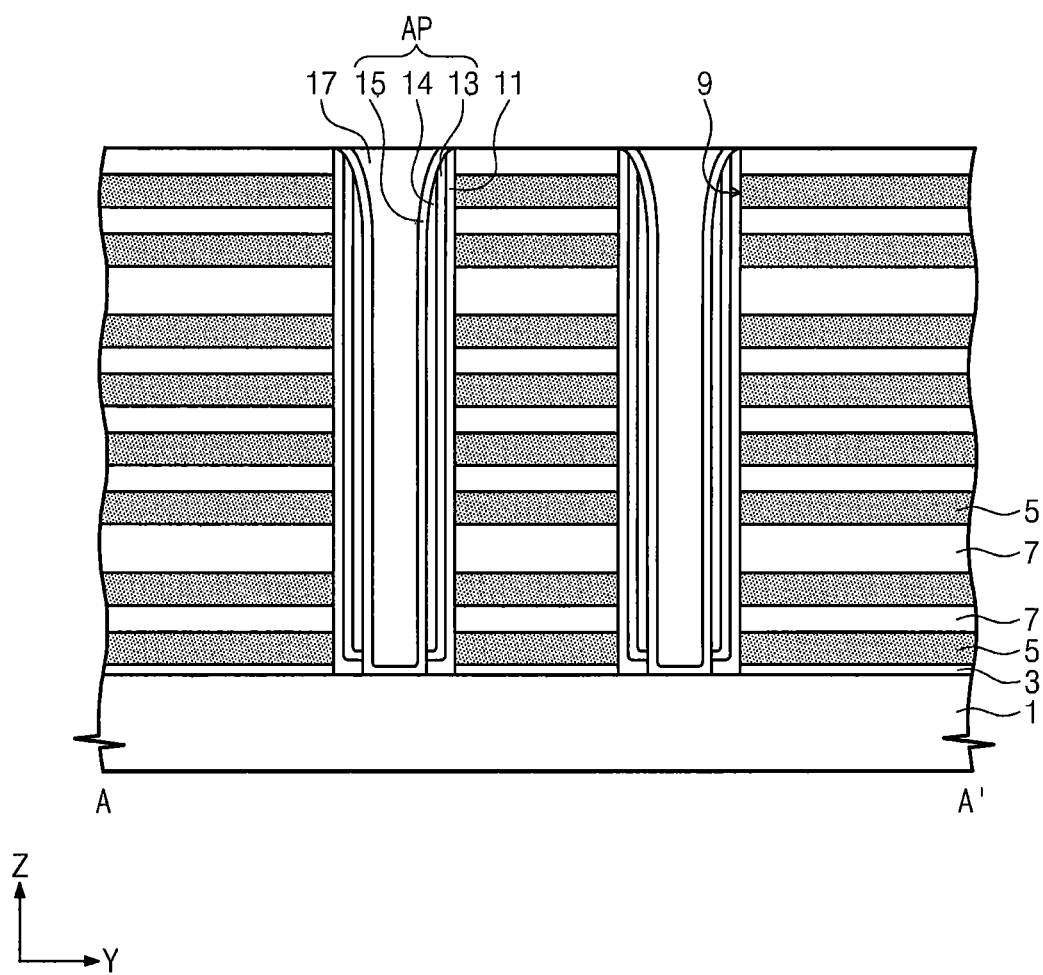

Referring to FIG. 7, a third semiconductor layer 15 may be conformally formed on the substrate 1, and then, a first filling layer 17 may be formed to fill each of the active holes 9. The third semiconductor layer 15 may be a silicon layer. However, the inventive concept is not limited thereto. In some embodiments, the third semiconductor layer 15 may be formed of a silicon-germanium (SiGe) layer having a high silicon content, or a silicon carbide layer. In some embodiments, the second semiconductor layer 14 may not be formed, and the third semiconductor layer 15 may be formed to be in direct contact with the first semiconductor layer 13. A planarization process may be performed on the first filling insulation layer and the third semiconductor layer 15. As a result, the first gate dielectric layer 11, an active pillar AP, and a first filling insulation pattern 17 may be formed in each of the active holes 9. When the third semiconductor layer 15 is formed, the third semiconductor layer 15 may be formed to have a poly-crystalline structure by a solid phase crystallization method. However, the inventive concept is not limited thereto. The third semiconductor layer 15 may be formed to have a single-crystalline structure. In some embodiments, the crystal structures of the first and second semiconductor layers 13 and 14 may be converted into a single-crystalline structure during the formation of the third semiconductor layer 15.

Figure 8:
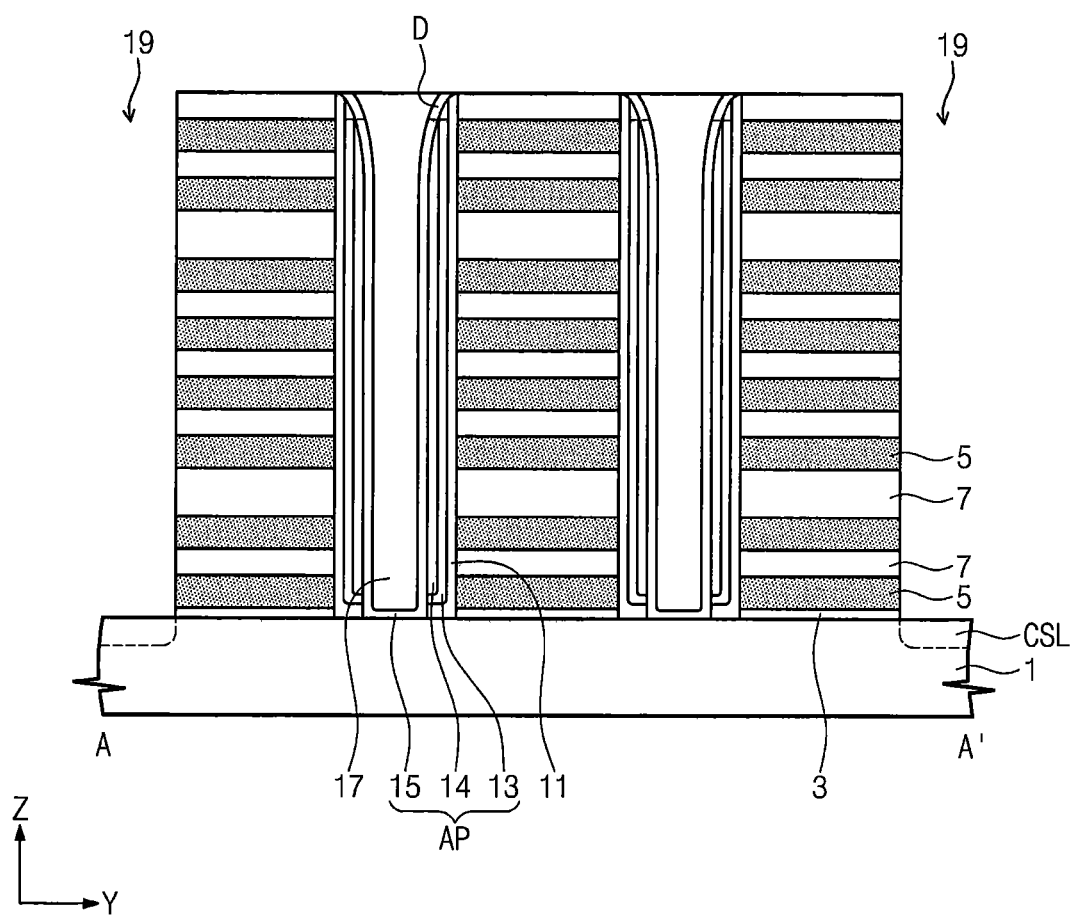

Referring to FIG. 8, the intergate insulating layers 7, the sacrificial layers 5, and the buffer oxide layer 3 may be successively patterned at positions spaced apart from the active holes 9 to form grooves 19 exposing the substrate 1. An ion implantation process may be performed to form a common source line CSL in the substrate 1 under each of the grooves 19 and a drain region D in a top end portion of the active pillar AP.

Figure 9:
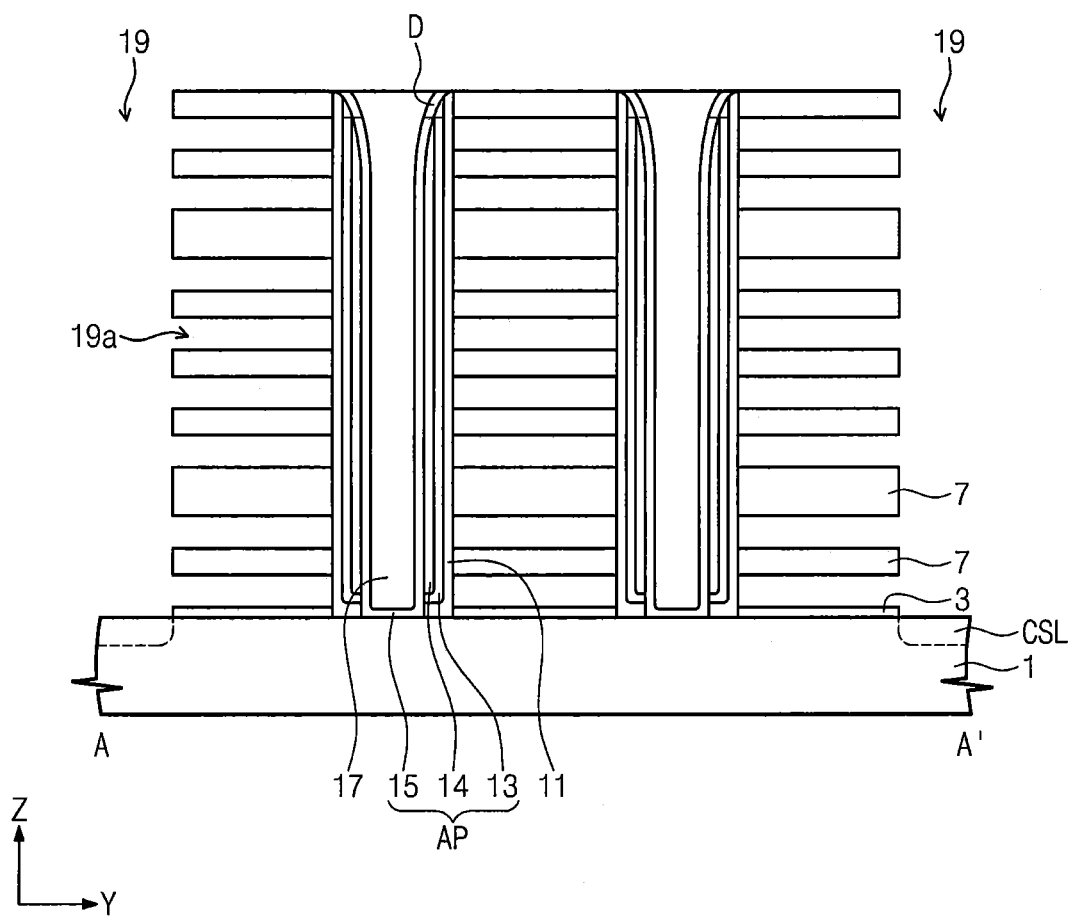

Referring to FIGS. 2 and 9, an isotropic etching process may be performed to remove the sacrificial layers 5 through the grooves 19. Thus, empty regions 19a are formed between the intergate insulating layers 7.

Referring again to FIGS. 2 and 3, a second gate dielectric layer 22 may be conformally formed in the empty regions 19a. Subsequently, a conductive layer may be formed to fill the empty regions 19a and at least a portion of the groove 19 by a deposition process. The conductive layer disposed in the groove 19 may be removed to form lower selection lines LSL, word lines WL0 to WL3, and upper selection lines USL. A second filling insulation pattern 20 may be formed to fill the groove 19. Thereafter, a separation groove 21 may be formed to divide the upper selection lines USL into upper selection line segments laterally separated from each other, and a separation insulating layer GSP may be formed to fill the separation groove 21. Next, a bit line BL may be formed to be connected to the drain region D.

In the method of fabricating the semiconductor memory device described above, a portion of the active pillar AP in which a channel region is not defined may be formed of the silicon layer. Thus, semiconductor fabricating processes skilled in processing the silicon layer may be directly applied to the fabricating method of the semiconductor memory device according to some embodiments of the inventive concept. This means that the semiconductor memory device may be easily fabricated.

Figure 10:
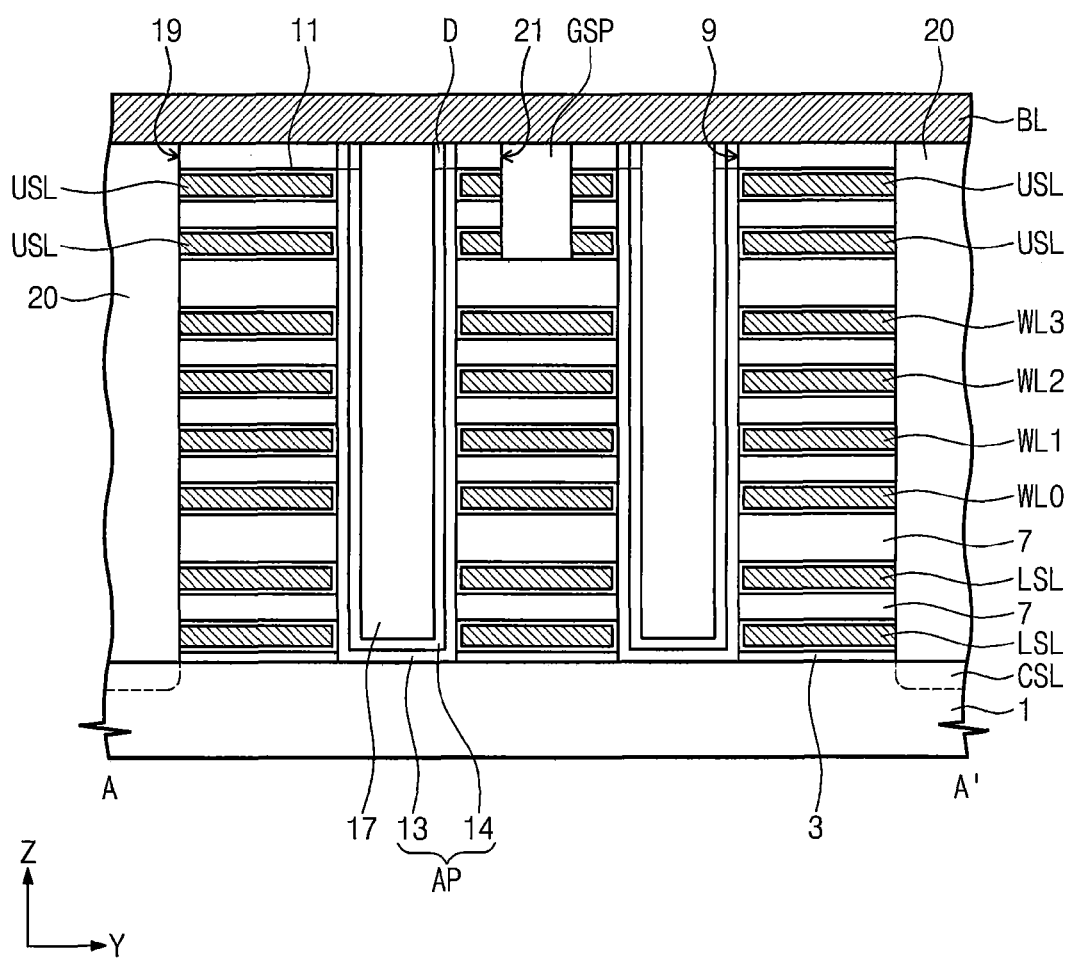
FIG. 10 is a cross-sectional view taken along a line A-A' of FIG. 2 to illustrate a semiconductor memory device according to some embodiments of the inventive concept.

FIG. 10 is a cross-sectional view taken along a line A-A° of FIG. 2 to illustrate a semiconductor memory device according to some embodiments of the inventive concept.

Referring to FIG. 10, in a semiconductor memory device according to some embodiments, a sidewall of each of the active holes 9 is not covered with the gate dielectric layer. An active pillar AP may include a first semiconductor layer 13 and a second semiconductor layer 14. The first semiconductor layer 13 may be formed of a material of which charge mobility is greater than that of silicon. For example, the first semiconductor layer 13 may be formed of at least one of germanium (Ge), silicon-germanium (SiGe), gallium-arse-nic (GaAs), indium-gallium-arsenic (InGaAs), and/or aluminum-gallium-arsenic (AlGaAs). The first semiconductor layer 13 may have a thickness or a width of about 50 Å or greater than 50 Å. The second semiconductor layer 14 may include a poly-silicon layer. The first semiconductor layer 13 may be in contact with the substrate 1. The first semiconductor layer 13 and the second semiconductor layer 14 may have cup shapes instead of spacer shapes. A gate dielectric layer 11 may be disposed between the first semiconductor layer 13 and each of the lines LSL, WL, and USL and between each of the lines LSL, WL, and USL and the intergate insulating layers 7 adjacent thereto. The gate dielectric layer 11 may include a tunnel dielectric layer, a charge storage layer, and a blocking dielectric layer.

Figure 11:
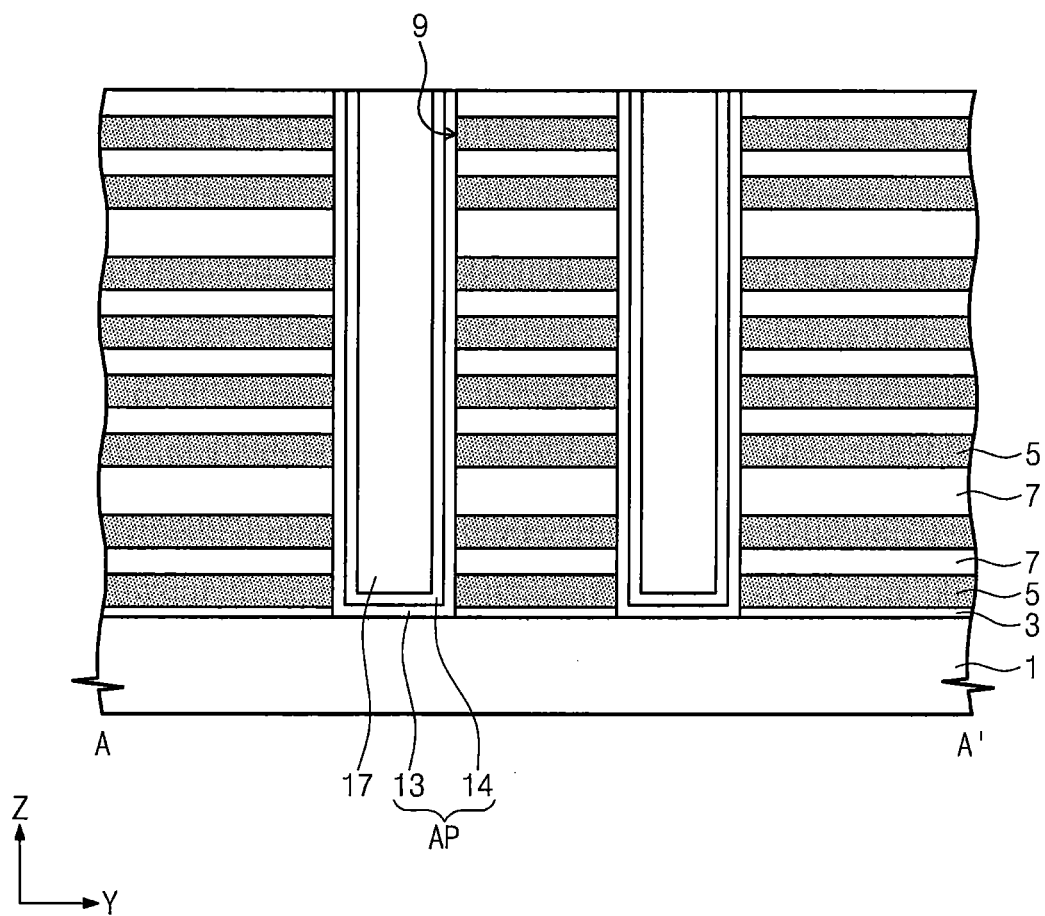
FIG. 11 is a cross-sectional view illustrating a method of fabricating the semiconductor memory device of FIG. 10.

FIG. 11 is a cross-sectional view illustrating a method of fabricating the semiconductor memory device of FIG. 10.

Referring to FIG. 11, a first semiconductor layer 13 and a second semiconductor layer 14 may be sequentially formed on an entire top surface of the substrate 1 of the structure illustrated in FIG. 5. The first and second semiconductor layers 13 and 14 may be conformally formed on the substrate 1. Next, a first filling insulation layer 17 may be formed to fill each of the active holes 9. A planarization process may be performed on the first filling insulation layer 17 and the second and first semiconductor layers 14 and 13 to form an active pillar AP and a first insulation pattern 17 in each of the active holes 9. Subsequently, the processes described with reference to FIGS. 8 and 9 may be performed.

Figure 12:
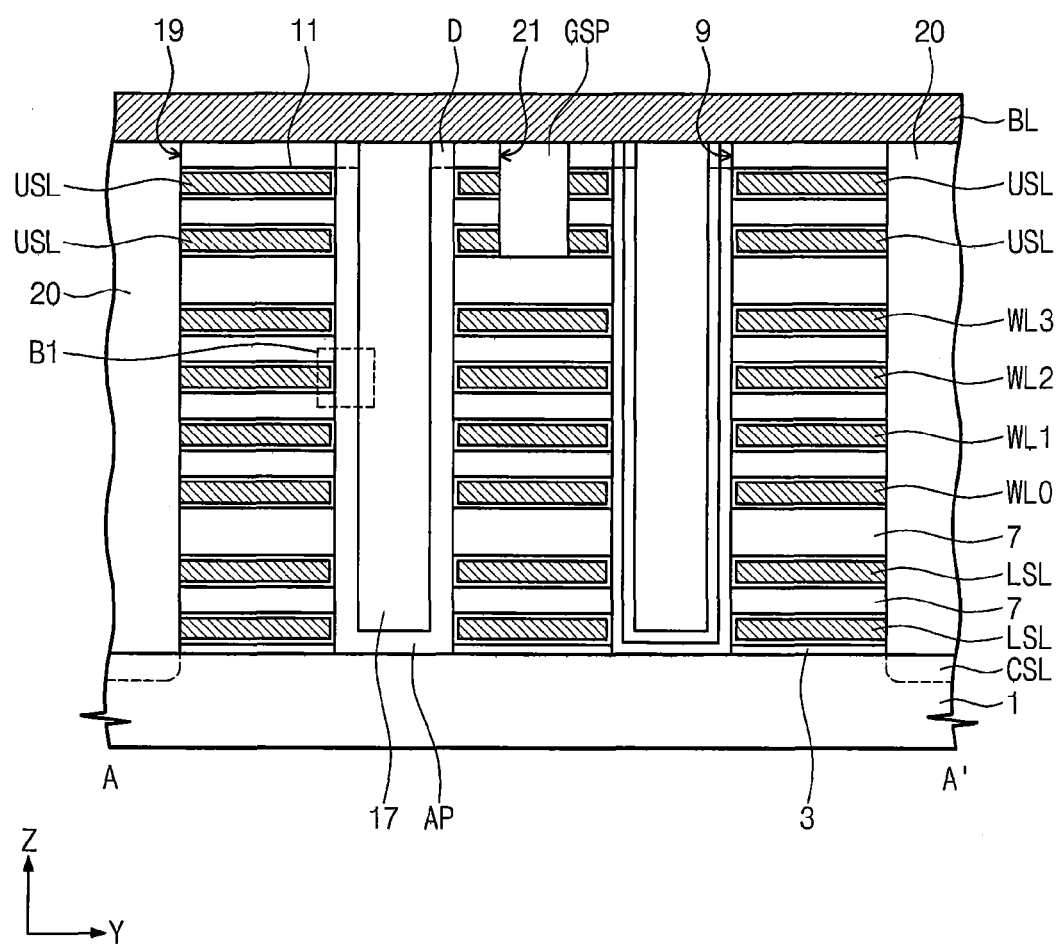
FIG. 12 is a cross-sectional view taken along a line A-A' of FIG. 2 to illustrate a semiconductor memory device according to some embodiments of the inventive concept.
Figure 13:
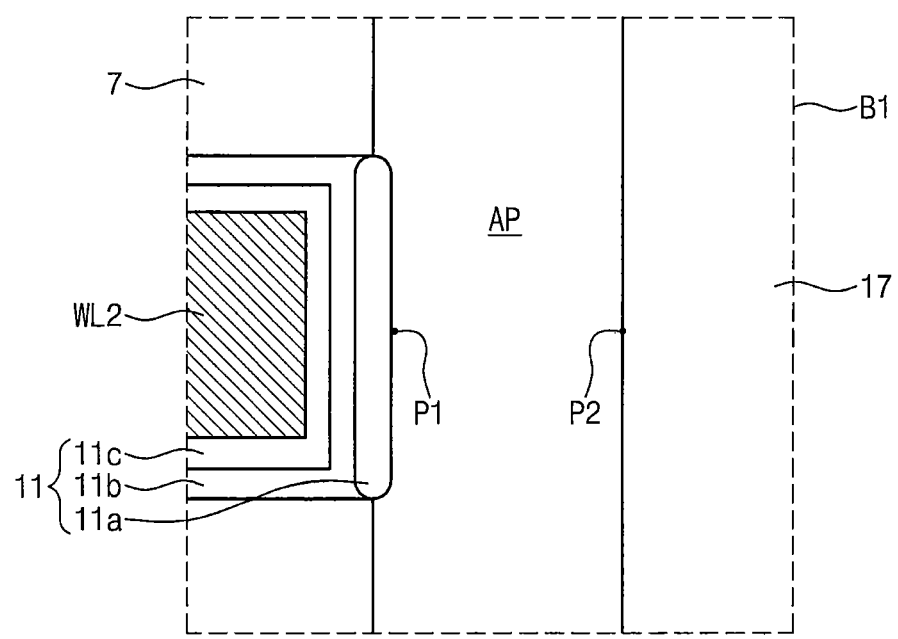
FIG. 13 is an enlarged view of the portion B1 of FIG. 12 according to some embodiments of the inventive concept.
Figure 14:
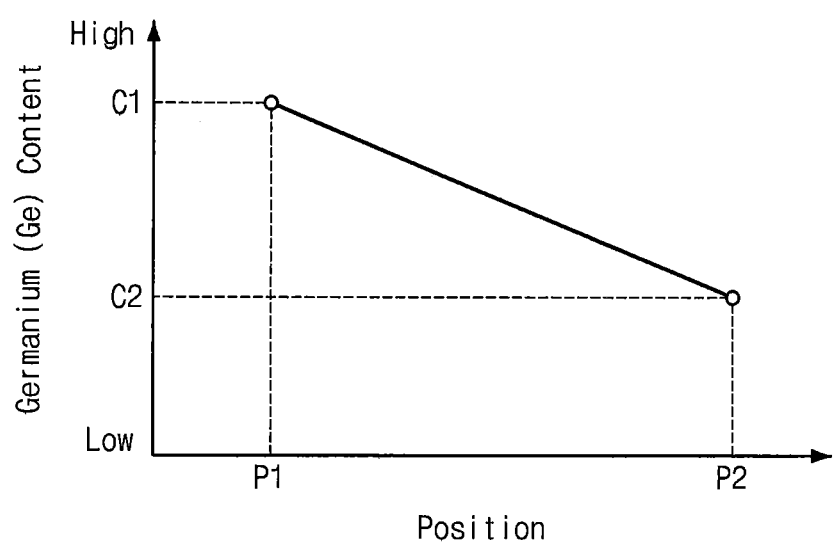
FIG. 14 is a graph illustrating a germanium content according to a position in an active pillar of FIG. 13.

FIG. 12 is a cross-sectional view taken along a line A-A' of FIG. 2 to illustrate a semiconductor memory device according to some embodiments of the inventive concept. FIG. 13 is an enlarged view of the portion B1 of FIG. 12 according to some embodiments of the inventive concept. FIG. 14 is a graph illustrating a germanium content according to a position in an active pillar of FIG. 13.

Referring to FIGS. 12, 13, and 14, an active pillar AP may be formed of a single-layered silicon-germanium layer according to some embodiments. Here, a germanium content may be varied according to a position in the active pillar AP. The active pillar AP may include a first portion P1 adjacent to the gate dielectric layer 11 and a second portion P2 spaced apart from the first portion P1. In some embodiments, the germanium content of the first portion P1 may be greater than that of the second portion P2. A silicon content of the first portion P1 may be lower than that of the second portion P2. The gate dielectric layer 11 may include a tunnel dielectric layer 11a, a charge storage layer 11b, and a blocking insulating layer 11c. The tunnel dielectric layer 11a may be formed of a thermal oxide layer, so it may be locally disposed between the active pillar AP and the charge storage layer 11b.

Figure 15:
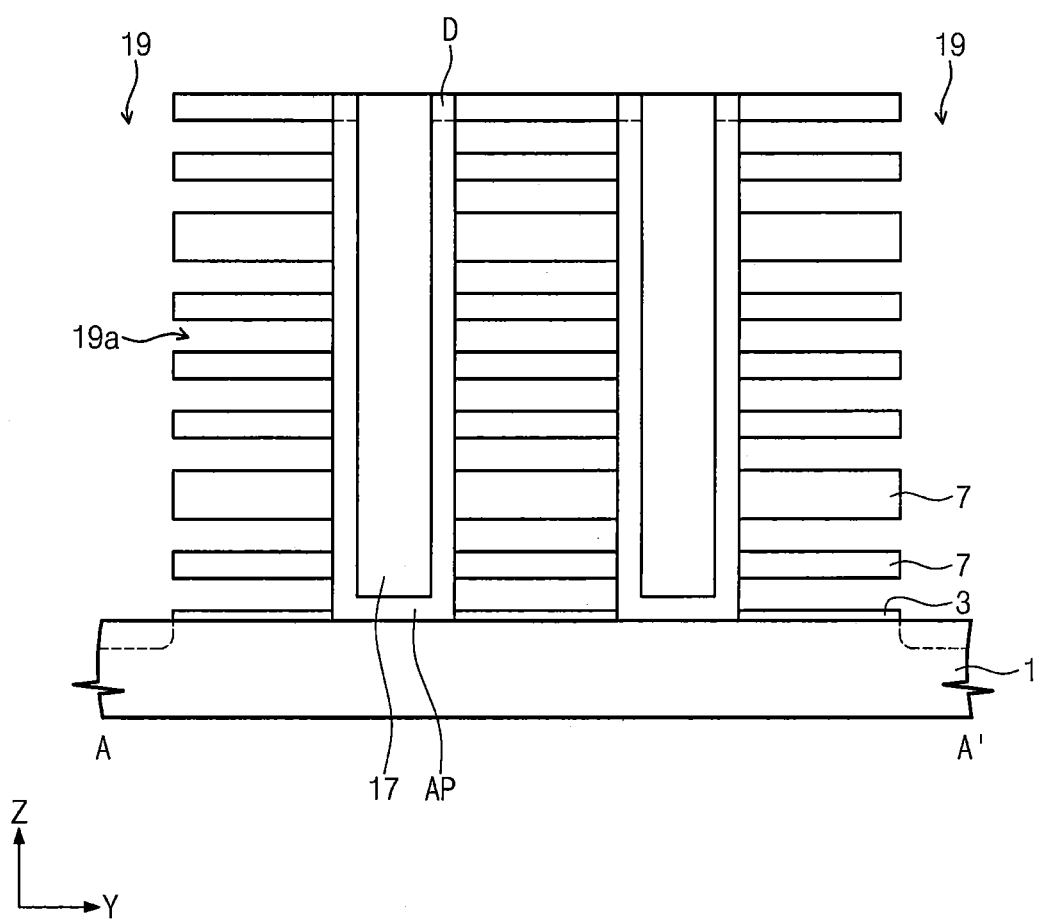
FIG. 15 is a cross-sectional view illustrating a method of fabricating the semiconductor memory device of FIG. 12.

FIG. 15 is a cross-sectional view illustrating a method of fabricating the semiconductor memory device of FIG. 12.

Referring to FIG. 15, a single-layered silicon-germanium layer is formed as an active pillar AP in each of the active holes 9 illustrated in FIG. 11 instead of the active pillar AP including the first and second semiconductor layers 13 and 14. A difference in the germanium content may not occur in the active pillar AP consisting of the single-layered silicon-germanium layer when the active pillar AP is formed. However, a sidewall of the active pillar AP may be thermally oxidized under an oxygen atmosphere when a gate dielectric layer 11 is formed after selective removal of the sacrificial layers 5. Reactivity between oxygen and silicon may be greater than reactivity between oxygen and germanium, and thus, the active pillar AP exposed through the empty regions 19a formed by the removal of the sacrificial layer 5 may be oxidized to be converted into at least a portion (e.g., the tunnel dielectric layer) of the gate dielectric layer 11. Silicon may be consumed in a first portion of the active pillar AP adjacent to the gate dielectric layer 11, so the germanium content of the first portion of the active pillar AP may increase. Since a second portion of the active pillar AP spaced apart from the gate dielectric layer 11 may not react with oxygen, the germanium content of the second portion of the active pillar AP may not increase. As a result, the germanium content difference according to a position may occur in the active pillar AP. In addition, the silicon content of the first portion of the active pillar AP may be lower than that of the second portion of the active pillar AP. Other fabricating processes of the semiconductor memory device may be the same as or similar to corresponding ones described with reference to FIGS. 4 to 9.

In some embodiments, the active pillar AP may be formed of the single-layered silicon-germanium layer, and a portion of the active pillar AP may be oxidized to form the at least a portion of the gate dielectric layer 11 and to cause a gradient of the germanium content according to the position of the active pillar AP concurrently. Thus, the fabricating processes of the semiconductor memory device may be simplified.

Figure 16:
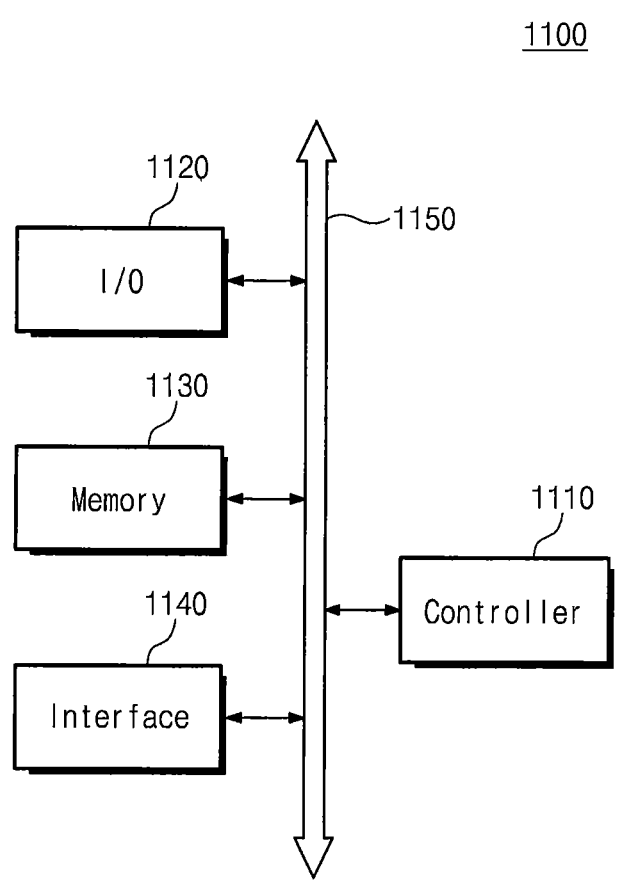
FIG. 16 is a schematic block diagram illustrating an electronic system including a semiconductor device according to some embodiments of the inventive concept.

FIG. 16 is a schematic block diagram illustrating an electronic system including a semiconductor device according to some embodiments of the inventive concept.

Referring to FIG. 16, an electronic system 1100 may be used in a personal digital assistant (PDA), a portable computer, a web tablet, a wireless phone, a mobile phone, a digital music player, or other electronic products receiving or transmitting information data by wireless.

The electronic system 1100 may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150.

The controller 1110 may include at least one of a microprocessor, a digital signal processor, a microcontroller, or other logic devices. Functions of the other logic devices may be a similar to those of the microprocessor, the digital signal processor and the microcontroller. The memory device 1130 may store commands that are to be executed by the controller 1110. The I/O unit 1120 may receive data or signals from an external system or may output data or signals to the external system. For example, the I/O unit 1120 may include a keypad, a keyboard and/or a display device.

The memory device 1130 may include at least one of the non-volatile memory devices according to some embodiments of the inventive concept. The memory device 1130 may further include at least one of another type of semiconductor memory devices and volatile random access memory devices.

The interface unit 1140 may transmit electrical data to a communication network or may receive electrical data from a communication network.

Figure 17:
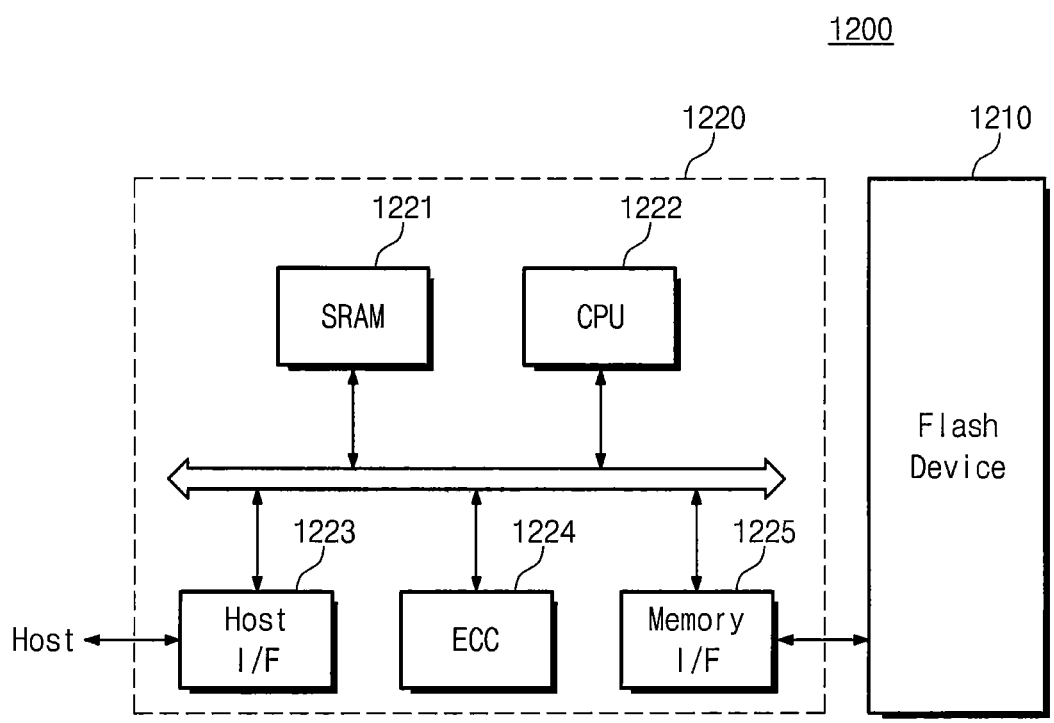
FIG. 17 is a schematic block diagram illustrating a data storage device including a semiconductor memory device according to some embodiments of the inventive concept.

FIG. 17 is a schematic block diagram illustrating a data storage device including a semiconductor memory device according to some embodiments of the inventive concept.

Referring to FIG. 17, a data storage device 1200 for storing high-capacity data may include a flash memory device 1210 implemented with at least one of the semiconductor memory devices according to some embodiments of the inventive concept. The data storage device 1200 may further include a memory controller 1220 that controls data communication between a host and the flash memory device 1210.

A static random access memory (SRAM) device 1221 may be used as a working memory of a central processing unit (CPU) 1222. A host interface unit 1223 may be configured to include a data communication protocol between the data storage device 1200 and the host. An error check and correction (ECC) block 1224 may detect and correct errors of data which are read out from the flash memory device 1210. A memory interface unit 1225 may connect the memory controller 1220 to the flash memory device 1210 according to some embodiments of the inventive concept. The CPU 1222 may control overall operations of the memory controller 1220 for exchanging data. The data storage device 1200 may further include a read only memory (ROM) storing code data for interfacing with the host.

The semiconductor memory devices and the data storage device described above may be encapsulated using various packaging techniques. For example, the semiconductor memory devices or the data storage device according to some embodiments of the present inventive concept may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and/or a wafer-level processed stack package (WSP) technique.

According to some embodiments of the inventive concept, the first portion, which is in contact with the gate dielectric layer, of the active pillar may include the semiconductor material of which the charge mobility is greater than that of silicon. When the semiconductor memory device is operated, the channel may be formed in the channel region defined in the first portion of the active pillar. Thus, mobility of charges in the channel region may increase to increase the cell current. In other words, a cell data read error may be reduced or possibly prevented by the increased cell current.

In addition, the second portion, in which the channel may not be formed, of the active pillar may include the silicon layer or the semiconductor layer having the high silicon content. Thus, semiconductor fabricating processes skilled in processing the silicon layer may be directly applied to easily fabricate the semiconductor memory device.

According to some embodiments of the inventive concept, the active pillar may be formed of the single-layered silicon-germanium layer, and a portion of the active pillar may be oxidized to form the gate dielectric layer and to cause the gradient of the germanium content of the active pillar concurrently. Thus, fabricating processes of the semiconductor memory device may be simplified.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor memory device comprising:
   an active pillar protruding from a substrate, the active pillar comprising silicon;
   a gate electrode adjacent to a sidewall of the active pillar; and
   a gate dielectric layer disposed between the active pillar and the gate electrode,
   wherein the active pillar comprises a first portion that is in contact with the gate dielectric layer and a second portion that is spaced apart from the gate dielectric layer,
   wherein a silicon content of the second portion is higher than a silicon content of the first portion, and
   wherein only one of the first and second portions directly contacts the substrate.

2. The semiconductor memory device of claim 1, wherein the first portion of the active pillar comprises a first semiconductor layer,
   wherein the second portion of the active pillar comprises a second semiconductor layer,
   wherein the first semiconductor layer includes germanium (Ge), silicon-germanium (SiGe), gallium-arsenic (GaAs), indium-gallium-arsenic (InGaAs), and/or aluminum-gallium-arsenic (AlGaAs), and
   wherein a silicon content of the second semiconductor layer is higher than a silicon content of the first semiconductor layer.

3. The semiconductor memory device of claim 2, wherein the active pillar further comprises a third semiconductor layer covering a sidewall of the second semiconductor layer, and
   wherein the third semiconductor layer includes a silicon layer.

4. The semiconductor memory device of claim 1, wherein the active pillar includes a single-layered silicon-germanium layer, and
   wherein a germanium content of the first portion is higher than a germanium content of the second portion.

5. The semiconductor memory device of claim 4, further comprising:
   a plurality of intergate insulating layers adjacent to the sidewall of the active pillar and disposed on and under the gate electrode,
   wherein the gate dielectric layer comprises a tunnel dielectric layer, a charge storage layer, and a blocking dielectric layer that are sequentially stacked on the sidewall of the active pillar,
   wherein the tunnel dielectric layer includes a thermal oxide layer and covers only a portion of the sidewall of the active pillar, and
   wherein the charge storage layer and the blocking dielectric layer are disposed between the gate electrode and the active pillar and between the gate electrode and one of the plurality of intergate insulating layers.

6. The semiconductor memory device of claim 1, wherein the gate dielectric layer comprises a tunnel dielectric layer, a charge storage layer, and a blocking dielectric layer that are sequentially stacked on the sidewall of the active pillar.

7. The semiconductor memory device of claim 1, wherein the first portion has a thickness about 50 Å or greater than 50 Å.

8. The semiconductor memory device of claim 1, wherein the active pillar has an amorphous structure, a single-crystalline structure, or a poly-crystalline structure.

9. The semiconductor memory device of claim 1, further comprising:
   a plurality of intergate insulating layers adjacent to the sidewall of the active pillar and disposed on and under the gate electrode,
   wherein the gate dielectric layer extends between the active pillar and the plurality of intergate insulating layers.

10. The semiconductor memory device of claim 1, wherein the first portion of the active pillar comprises an 'L' shaped semiconductor layer.

11. The semiconductor memory device of claim 1, wherein a germanium content of the second portion is lower than a germanium content of the first portion.

12. A semiconductor memory device comprising:
    a plurality of intergate insulating layers and a plurality of gate electrodes alternately stacked on a substrate;
    an active pillar extending through the plurality of intergate insulating layers and the plurality of gate electrodes and being connected to the substrate; and
    a first gate dielectric layer covering a sidewall of the active pillar,
    wherein the active pillar comprises a first portion that is in contact with the first gate dielectric layer and a second portion that is spaced apart from the first gate dielectric layer,
    wherein the first portion includes a first semiconductor material having a charge mobility that is greater than a charge mobility of silicon, and
    wherein the second portion includes a second semiconductor material having a silicon content that is higher than a silicon content of the first semiconductor material and being connected to the substrate.

13. The semiconductor memory device of claim 12, wherein the first gate dielectric layer comprises a tunnel dielectric layer, a charge storage layer, and a blocking dielectric layer which are sequentially stacked on a sidewall of the first portion of the active pillar.

14. The semiconductor memory device of claim 12, wherein the first portion of the active pillar comprises a first semiconductor layer,
    wherein the second portion of the active pillar comprises a second semiconductor layer,
    wherein the first semiconductor layer includes the first semiconductor material,
    wherein a bottom surface of the first semiconductor layer is spaced apart from the substrate, and
    wherein the second semiconductor layer includes a silicon layer and is connected to the substrate.

15. The semiconductor memory device of claim 14, further comprising:
    a second gate dielectric layer disposed between one of the plurality of gate electrodes and one of the plurality of intergate insulating layers and between the first gate dielectric layer and the plurality of gate electrodes,
    wherein a dielectric constant of the second gate dielectric layer is higher than a dielectric constant of a silicon oxide layer.

16. The semiconductor memory device of claim 14, wherein the first semiconductor layer includes germanium (Ge), silicon-germanium (SiGe), gallium-arsenic (GaAs), indium-gallium-arsenic (InGaAs), and/or aluminum-gallium-arsenic (AlGaAs).

17. The semiconductor memory device of claim 16, wherein the first semiconductor layer of the active pillar has a poly-crystalline structure.

18. A semiconductor memory device comprising:
an active pillar protruding from a substrate;
a plurality of gate electrodes surrounding the active pillar and sequentially stacked on the substrate; and
a gate dielectric layer disposed between the active pillar and the plurality of gate electrodes,
wherein the active pillar comprises a first portion that is in contact with the gate dielectric layer and a second portion that is spaced apart from the gate dielectric layer,
wherein the first portion of the active pillar includes a first silicon-germanium (SiGe) layer,
wherein the second portion of the active pillar includes a second silicon-germanium (SiGe) layer, and
wherein a silicon content of the first silicon-germanium (SiGe) layer is lower than a silicon content of the second silicon-germanium (SiGe) layer.

19. The semiconductor memory device of claim 18, wherein a germanium content of the first silicon-germanium (SiGe) layer is higher than a germanium content of the second silicon-germanium (SiGe) layer.

20. The semiconductor memory device of claim 19, wherein the gate dielectric layer comprises a tunnel dielectric layer, a charge storage layer, and a blocking dielectric layer that are sequentially stacked on a sidewall of the active pillar.

* * * * *